United States Patent
Scholz (10) Patent No.: US 9,460,844 B2
(45) Date of Patent: Oct. 4, 2016

(54) PLANAR TRANSMITTER WITH A LAYERED STRUCTURE

(71) Applicant: Phoenix Contact GmbH & Co. KG, Blomberg (DE)

(72) Inventor: Peter-Dominik Scholz, Brakel (DE)

(73) Assignee: Phoenix Contact GmbH & Co. KG (DE)

( * ) Notice: Subject to any disclaimer, the term of this patent is extended or adjusted under 35 U.S.C. 154(b) by 116 days.

(21) Appl. No.: 14/379,433

(22) PCT Filed: Feb. 18, 2013

(86) PCT No.: PCT/EP2013/000472
§ 371 (c)(1),
(2) Date: Aug. 18, 2014

(87) PCT Pub. No.: WO2013/124049
PCT Pub. Date: Aug. 29, 2013

(65) Prior Publication Data
US 2015/0022306 A1    Jan. 22, 2015

(30) Foreign Application Priority Data
Feb. 22, 2012 (DE) .................. 10 2012 003 364

(51) Int. Cl.
*H01F 5/00* (2006.01)
*H01F 27/28* (2006.01)
(Continued)

(52) U.S. Cl.
CPC ... *H01F 27/2804* (2013.01); *H01F 2027/2809* (2013.01); *H01F 2027/2819* (2013.01); *H05K 1/165* (2013.01); *H05K 2201/086* (2013.01)

(58) Field of Classification Search
CPC .............. H01F 2027/2809; H01F 2027/2819; H05K 1/165; H05K 2201/086
USPC .................................. 336/200, 192, 83, 198
See application file for complete search history.

(56) References Cited

U.S. PATENT DOCUMENTS 4,201,965 A    5/1980 Onyshkevych
4,873,757 A *  10/1989 Williams ............ H01F 17/0013
                                                    29/602.1
(Continued)

FOREIGN PATENT DOCUMENTS

DE    2927364 A1    1/1981
DE    3322004 A1    12/1984
(Continued)

OTHER PUBLICATIONS

Officer: Anges Wittmann-Regis, "Related International Application No. PCT/EP2013/000472", "International Preliminary Report on Patentability", Aug. 28, 2014, Publisher: PCT/IB, Published in: CH.
(Continued)

*Primary Examiner* — Elvin G Enad
*Assistant Examiner* — Kazi Hossain
(74) *Attorney, Agent, or Firm* — Kaplan Breyer Schwarz & Ottesen, LLP (57) ABSTRACT

A planar intrinsically safe transducer having a vertical extension and a horizontal extension having a layer structure with a plurality of circuits, wherein a first circuit and a second circuit are galvanically isolated from one another. Further, the transducer has a magnetic core 4, which at least partially encompasses the layer structure and acts at least on the first circuit and on the second circuit, wherein the first circuit and the second circuit lie in one plane and form a layer of the layer structure.

7 Claims, 5 Drawing Sheets

(51) Int. Cl.
*H01F 27/29* (2006.01)
*H01F 27/02* (2006.01)
*H05K 1/16* (2006.01)

(56) References Cited

U.S. PATENT DOCUMENTS

| | | | | |
|---|---|---|---|---|
| 5,353,001 | A * | 10/1994 | Meinel | H01F 17/0006 29/602.1 |
| 5,479,695 | A | 1/1996 | Grader et al. | |
| 5,565,837 | A * | 10/1996 | Godek | H01F 17/0006 174/250 |
| 5,844,461 | A * | 12/1998 | Faulk | H01F 27/2804 336/178 |
| 6,587,026 | B2 * | 7/2003 | Yeh | H01F 27/2804 336/200 |
| 8,610,533 | B2 * | 12/2013 | Nussbaum | H01F 27/2804 212/233 |
| 2002/0140539 | A1 * | 10/2002 | Takashima | H01F 17/0013 336/200 |
| 2008/0239759 | A1 * | 10/2008 | Nakahori | H01F 27/2804 363/20 |
| 2008/0278275 | A1 * | 11/2008 | Fouquet | H01F 27/2804 336/84 M |
| 2010/0079233 | A1 * | 4/2010 | Koprivnak | H01F 27/2804 336/200 |
| 2010/0164670 | A1 * | 7/2010 | Nakahori | H01F 27/2804 336/200 |
| 2011/0095620 | A1 | 4/2011 | Fouquet et al. | |
| 2011/0140824 | A1 * | 6/2011 | Herhold | H01F 27/2804 336/200 |
| 2011/0241816 | A1 * | 10/2011 | Park | H01F 27/2804 336/200 |

FOREIGN PATENT DOCUMENTS

| | | |
|---|---|---|
| DE | 3425153 A1 | 1/1986 |
| DE | 29611276 U1 | 9/1997 |
| DE | 10084799 T5 | 4/2004 |
| DE | 102004011958 A1 | 9/2004 |
| DE | 102005041131 A1 | 5/2007 |
| DE | 102010014281 A1 | 10/2011 |
| DE | 102010045826 A1 | 3/2012 |
| EP | 0715322 A1 | 6/1996 |
| EP | 1391900 A1 | 2/2004 |
| GB | 2251208 A | 7/1992 |
| GB | 2252208 A | 7/1992 |
| GB | 2355343 A | 4/2001 |
| WO | 9741639 A1 | 11/1997 |
| WO | 2004040599 A1 | 5/2004 |

OTHER PUBLICATIONS

"Related German Patent Application No: 10 2012 003 364.8 Office Action", Aug. 9, 2012, Publisher: DE Patent Office, Published in: DE.

"Related International Patent Application No: PCT/EP2013/000472", "International Preliminary Report on Patentability", Jun. 6, 2014, Publisher: PCT, Published in: EP.

"Related International Patent Application No: PCT/EP2013/000472", "International Search Report and Written Opinion", Publisher: PCT/ISA, Published in: EP.

"Office Action" issued in counterpart German Patent Application No. 102012003364.8, dated Apr. 26, 2016, Published in: DE.

* cited by examiner

PLANAR TRANSMITTER WITH A LAYERED STRUCTURE

FIELD OF THE INVENTION

The present invention relates generally to the field of interface technology with electronic components which may be used for measurement, control and regulation tasks, in particular as isolating amplifiers. These isolating amplifiers provide galvanic isolation between a primary circuit and a secondary circuit and are suitable, for example, for intrinsically safe operation.

The present invention relates to a transducer, in particular a planar transducer which is not susceptible to interference and which is suitable for intrinsically safe circuits, and is referred to in the following as a planar intrinsically safe transducer.

BACKGROUND OF THE INVENTION

Intrinsically safe transducers or transformers are used for the galvanic isolation of circuits in accordance with various standards, wherein energy as well as signals and/or data can be transmitted via the transducers.

Minimum distances for the separation of the circuits and therefore also for the turns or windings of the transformers for different safety classes are specified in various regulations and norms, for example DIN EN 60079-11. These minimum distances depend on the insulating medium, so that the minimum distances are subdivided into solid insulation, clearance and creepage distances. In a typical insulation class, for example protection level 375 V, the minimum separating distance for solid insulation, for example, is 1 mm, the creepage distance in air is 10 mm and the creepage distance under a protective layer is about 3.3 mm.

Intrinsically safe transducers are designed and optimized with regard to the geometry in such a way that the required separating distances for a particular protection level are ensured. This can be provided by wound coils as well as by printed or etched coils on printed circuit boards. Here, in the case of printed or etched coils, it is of advantage that no additional winding processes are required and a good reproducibility can be guaranteed. Further advantages can lie in an improved thermal characteristic for the same core volume. Furthermore, manufacturing costs can be lower.

DE 10 2005 041 131 A1 discloses an intrinsically safe transducer with wound coils, wherein, due to the required insulation distances, the windings of the coils are arranged on different ring cores which are magnetically coupled to one another by means of an additional winding embedded in a printed circuit board. The transducer so formed is based on classical winding technology combined with a printed circuit board technology, wherein the printed circuit board is used for insulation as well as for mechanical fixing.

A transducer, with which the circuits or windings to be insulated are arranged asymmetrically on different printed circuit boards which are subsequently connected on top of one another with a magnetic core to form a transformer or transducer, is proposed in US 2011/0140824 A1. Here, the core can be formed from two halves, which, for example, are glued and/or clamped in order to guarantee mechanical stability.

A planar transducer for miniaturized applications having two windings which lie on opposite sides of an insulating substrate is described in US 2011/0095620 A1. The fundamental physical principle of energy or data transmission is based on induction. Here, however, the transducer is not an intrinsically safe transducer and neither is a magnetic core used.

A transducer or transformer, the conductor tracks of which are manufactured entirely in planar technology with layer structure, in which the conductor tracks are accommodated in a printed circuit board which is joined together to form one piece, is described in EP 0 715 322 A1. The printed circuit board is encompassed by a closed magnetic core.

SUMMARY OF THE INVENTION

It is an object of the present invention to propose miniaturization possibilities of the planar transducers described above, in particular to enable a miniaturization of intrinsically safe planar transducers.

According to the invention, a planar intrinsically safe transducer having a vertical extension and a horizontal extension is provided. The transducer has a layer structure with a plurality of circuits, wherein a first circuit and a second circuit are galvanically isolated from one another. Further, the transducer has at least one magnetic core, which at least partially encompasses the layer structure and acts at least on the first circuit and on the second circuit, wherein the first circuit and the at least one second circuit lie substantially in one plane and form a layer of the layer structure.

The circuits can also be formed differently on different intermediate layers within the insulating layers so that the circuits continue to lie substantially in one plane within the insulating layers which are formed in a common dimension, for example in the horizontal direction, and form a layer of the layer structure without coming electrically into contact with one another.

The transducer or transformer according to the invention can fulfill all the required safety distances according to the norm DIN EN 60079-11 and at the same time offers functionality with regard to energy and/or data or signal transmission.

According to the invention, the overall thickness of a transducer is reduced or minimized. This is of advantage particularly when the transducers are to be integrated into narrow housings, which, for example, have an overall thickness of approx. 6 mm and when the space available within the housing is a maximum of about 4.5 mm. A particular advantage of the invention is therefore to be able to provide an intrinsically safe transducer which does not exceed an overall thickness of 4.5 mm for example. An advantage of the invention is that the installation height of the intrinsically safe transducer is reduced for the same or only slightly increased horizontal dimensions.

According to an exemplary embodiment of the transducer according to the invention, an overall height of the transducer is four times a total insulation distance of a minimum insulation thickness T0.

According to the invention, a design of the required insulation for intrinsically safe operation is sized such that N−1 insulation thicknesses are now relocated to the horizontal extension of the transducer according to the invention, wherein N is the number of circuits used.

When relocating the circuits next to one another in the horizontal extension, it must be ensured that none of the circuits come closer than permissible to another potential group; this also applies in particular to the magnetic core.

According to an embodiment of the transducer according to the invention, it can be provided that an overall insulation thickness in the vertical extension of the transducer is 1×T0, wherein T0 is a minimum insulation distance. Therefore, one times T0 is required instead of N×T0 with conventional transducers, wherein N is the number of circuits which are safely galvanically isolated from one another.

According to an embodiment of the transducer according to the invention, with a required minimum insulation thickness T0 of an insulation layer of about 1 mm, the overall thickness of the transducer is not substantially greater than about 4 mm. Thicknesses of conductor tracks, insulation materials, ferrites, varnishes etc. are taken into account in the overall thickness of the transducer.

The geometry of the magnetic cores or core parts can also be optimized or minimized in such a way that the space requirement becomes minimal and the geometric shape of the cores or core parts becomes as simple as possible. This is in accord with a required cost optimization of electronic devices which contain intrinsically safe transducers.

BRIEF DESCRIPTION OF THE DRAWINGS

Exemplary embodiments of the invention are shown purely schematically in the drawings and are described in more detail below. In the drawings.

DETAILED DESCRIPTION

Figure 1:
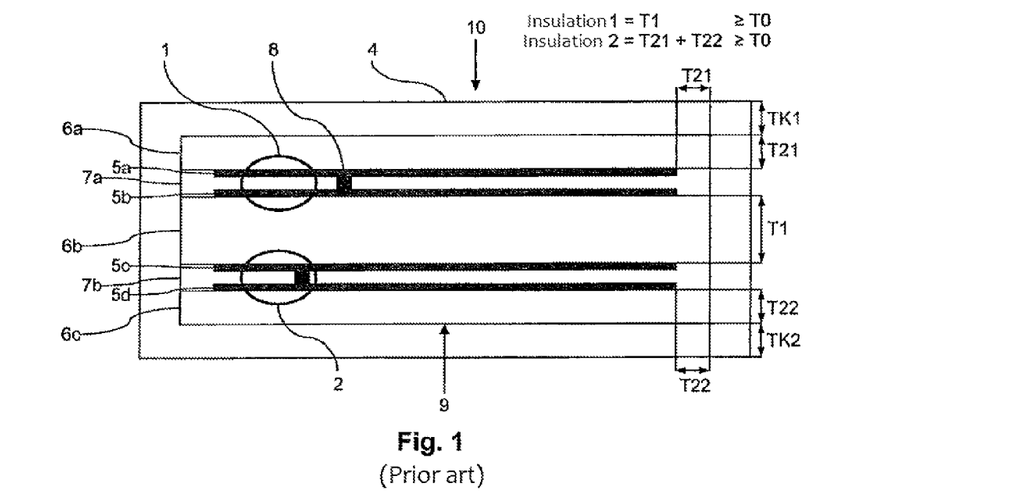
FIG. 1 shows a schematic diagram of a conventional transducer with two circuits.

FIG. 1 shows a schematic diagram of a conventional transducer 10 with a first circuit 1 and a second circuit 2. The transducer 10 is designed as an intrinsically safe printed circuit board transducer, similar to the printed circuit board transducer as described, for example, in EP 0 715 322 A1. The transducer 10 has a layer structure with primary and a secondary side, which are formed by the two circuits 1, 2 respectively. The transducer or transformer is formed by an inductive coupling of the two circuits 1, 2 with, at the same time, galvanic isolation of the circuits 1, 2.

FIG. 1 shows a cross section through a printed circuit board 9 or printed circuit board arrangement 9, which is encompassed by a core 4, wherein the core 4 penetrates the printed circuit board 9 at a plurality of points. The penetration can be provided, for example, by milled holes in the printed circuit board 9. The printed circuit board 9 has a plurality of layers which are made up of layers of conductor tracks 5a to 5d and insulation layers 6a to 6c and 7a to 7b. In this special layer structure, the insulation layers can be subdivided into those (6a to 6c) which separate the individual circuits 1, 2 from one another, and those (7a to 7b) which provide insulation within the individual circuits. The insulation layers 7a to 7b enable many conductor structures, such as, for example, spiral-shaped windings on the layer 5a, which can be provided with a return conductor on the layer 5b. The layers within a circuit can be connected by means of an electrical contact 8, such as a through-hole contact for example.

In the layer structure of the intrinsically safe transformer from FIG. 1, the two circuits 1, 2 or potential groups 1, 2 are galvanically isolated from one another by means of a first solid insulation or solid material insulation of thickness T1 (insulation 1). Here, the insulation thickness T1 is greater than or equal to the protection level required for the protection class, which is a necessary condition for an intrinsically safe transducer. The required protection level therefore corresponds to the minimum insulation distance T0, also referred to as required insulation thickness or minimum insulation thickness. As the core 4 is considered to be a conducting body, as well as the necessary first insulation between the primary and secondary side (insulation 1), a second insulation must also be ensured between the individual windings of the circuits and the core 4 (insulation 2). In doing so, the second insulation can be divided into two parts T21 and T22, wherein the sum of the thicknesses T21 and T22 of the second insulation is likewise greater than or equal to the minimum insulation thickness T0 which is required for the protection class. For example, the two parts of the second insulation have an equal thickness.

An additional auxiliary condition for the design of a transducer is, for example, stipulated in DIN EN 60079-11 in such a way that neither of the two parts T21 and T22 may be less than a minimum percentage of the overall second insulation, for example one-third of the second insulation. As a rule, the two parts T21 and T22 are chosen to be identical and equal to half of the first insulation for reasons of symmetry.

The classic printed circuit board transducer 10 is equipped with a magnetic core 4 in order to achieve the most optimum magnetic conductivity possible combined with a maximum shielding effect. Here, the magnetic core 4 encompasses the printed circuit board 9 or parts of the printed circuit board with or without an air gap and is arranged both above and below the printed circuit board 9 as well as on each side of the printed circuit board 9. As the thicknesses TK1 and TK2 of the magnetic core 4 above and below the printed circuit board 9 determined by the manufacturing process are typically greater than the required insulation thickness T0 with TK1, TK2>T0 (when T0 is 1 mm for example), this results in an overall thickness of the printed circuit board transducer 10 of at least four times the minimum insulation thickness T0. The layer thicknesses of the conductor tracks (5a to 5d) and the thicknesses of the additional insulation layers (7a to 7b) have not yet been included at this juncture.

If the required thickness of the insulation layer T0 is 1 mm, for example, then the overall thickness of the classic printed circuit board transducer 10 is greater than 4 mm. In many applications, the thickness is between 6 mm and 12 mm for a total surface area of approx. 6 cm² to 8 cm².

Figure 2:
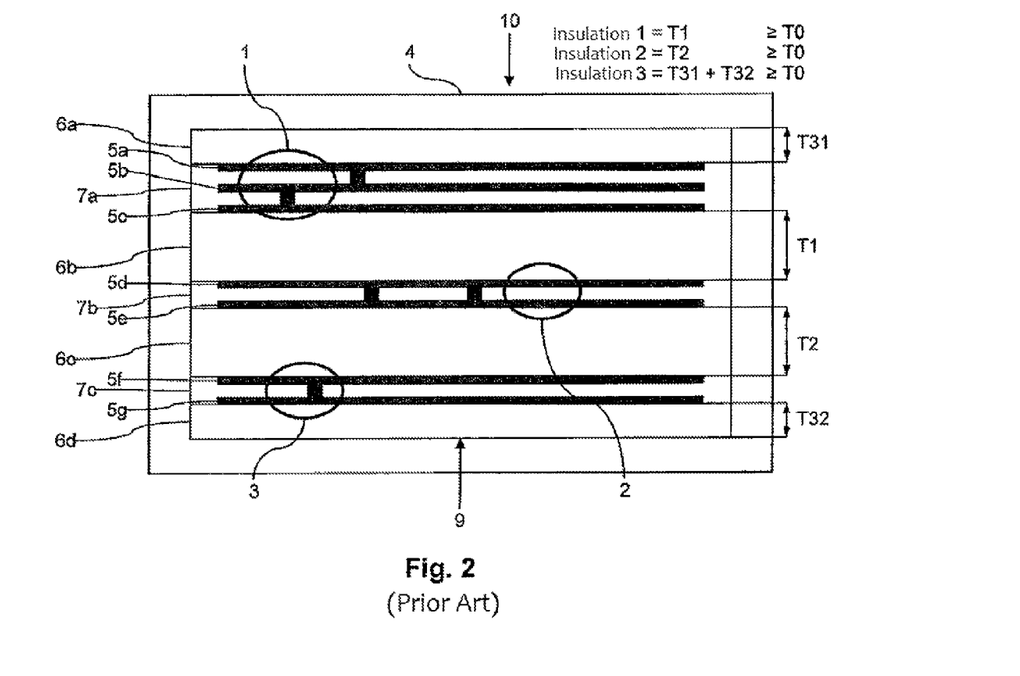
FIG. 2 shows a schematic diagram of a conventional transducer with three circuits.

FIG. 2 shows a schematic diagram of a conventional transducer 10 with three circuits 1, 2, 3. FIG. 2 shows a layer structure of a printed circuit board 9 in the case of three safely galvanically isolated circuits 1, 2, 3 as a further embodiment starting from FIG. 1. In this example, the windings of the first circuit 1 or of the first potential group 1 are designed as three conductor track planes 5a to 5c, while the windings of the circuit 2 and of the circuit 3 are in each case designed with two conductor track planes 5d and 5e and 5f and 5g respectively.

As a consequence of the earlier concept of intrinsically safe operation, three insulation layers with a first insulation (insulation 1), a second insulation (insulation 2) and a third insulation (insulation 3), which in each case must be chosen to be greater than or equal to the minimum insulation thickness T0, must be used for safe galvanic isolation of all three circuits 1, 2, 3. Consequently, this increases the overall thickness of the transducer 10. In general, for N circuits which are safely galvanically isolated from one another, the total insulation thickness is at least N×T0. The overall thickness of the transducer 10 takes into account further layer thicknesses, such as, for example, the conductor track thickness 5a to 5g and the further insulation layers 7a to 7c.

Figure 3:
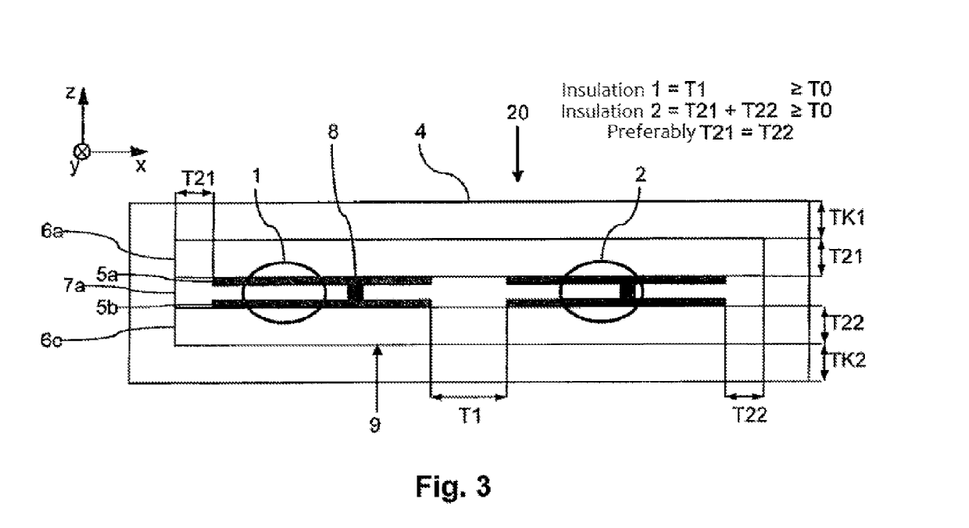
FIG. 3 shows a schematic diagram of a transducer with two circuits according to an exemplary embodiment of the invention.

FIG. 3 shows a schematic diagram of a transducer 20 according to an exemplary embodiment of the invention with two windings or a first circuit 1 and a second circuit 2 which are galvanically isolated from one another. A first insulation (insulation 1) with the insulation thickness T1 is located between the individual circuits 1, 2. In comparison with the embodiment of FIG. 1, the first insulation (insulation 1) is relocated out of the vertical dimension into the horizontal dimension. In this context, in all figures, the horizontal dimension designates the extension parallel to the printed circuit board (sketched as x-direction or y-direction in FIG. 3), and the vertical dimension the extension perpendicular to the printed circuit board (z-direction in FIG. 3).

The present invention uses an alternative layer structure or an alternative printed circuit board structure or printed circuit board layering compared with the conventional exemplary embodiments shown in FIG. 1 and FIG. 2. As described, with the conventional transducers, the overall insulation thickness is at least N×T0, wherein N designates the number of safely isolated circuits and T0 the minimum insulation thickness in the insulating medium taking into account the protection level.

As a result of arranging the circuits 1, 2 next to one another, the overall thickness of the transducer according to the invention can be reduced, and the overall insulation thickness is reduced from at least N×T0 to a minimum of only 1×T0. In the case of a plurality of circuits 1, 2 to be insulated, for example three circuits 1, 2, 3, these further circuits can also be relocated in the horizontal dimension.

The overall insulation thickness is reduced to 1×T0 by relocating the insulation between the individual circuits in the horizontal dimension. In the special case of two (N=2) circuits to be insulated, the minimum overall insulation thickness of 2×T0 is reduced by a reduction factor of 2 to 1×T0. In general, the reduction factor is equal to N.

Figure 4:
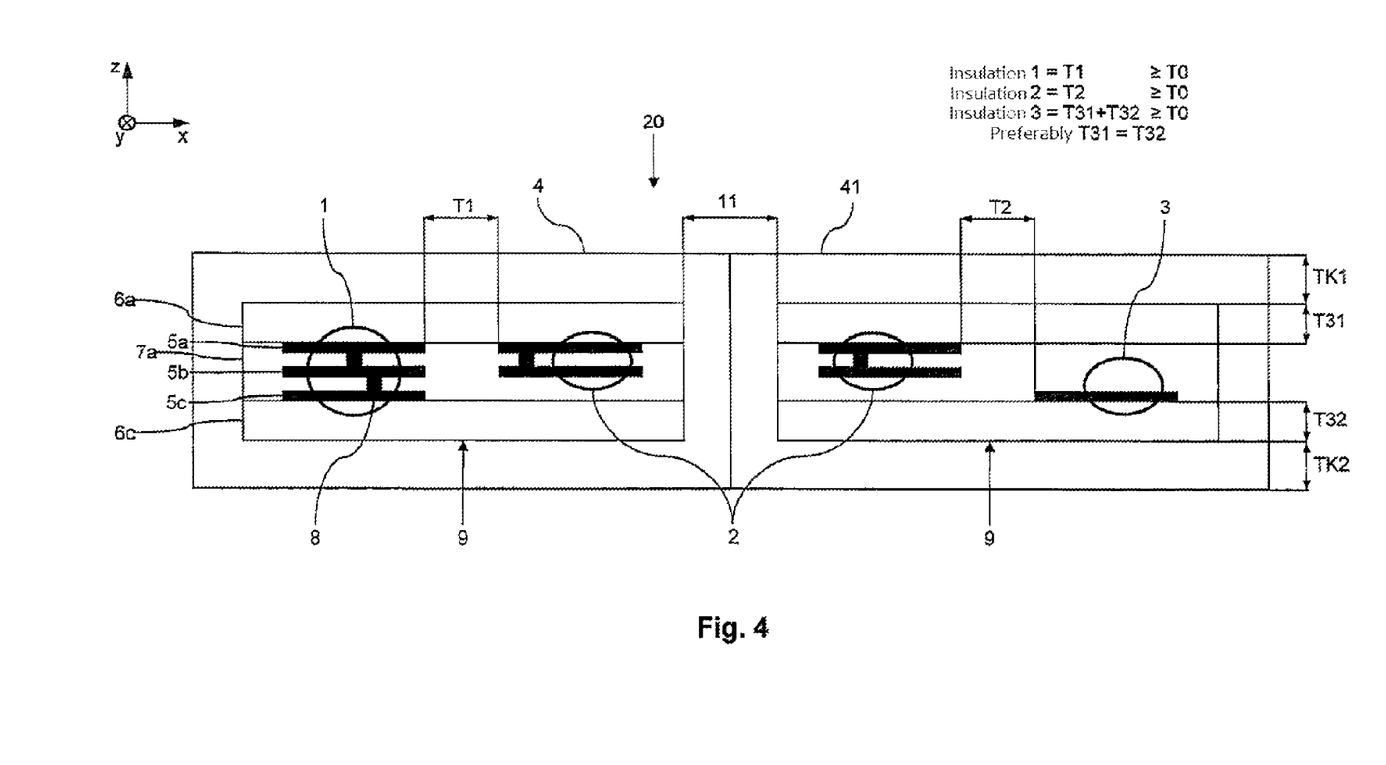
FIG. 4 shows a schematic diagram of a transducer with three circuits according to an exemplary embodiment of the invention.

FIG. 4 shows a schematic diagram of a transducer 20 according to an exemplary embodiment of the invention with three windings or a first circuit 1, a second circuit 2 and a third circuit, which are galvanically isolated from one another and, according to the invention, are arranged horizontally next to one another. The first winding 1 extends over three layers 5a to 5c of the printed circuit board structure 9, the second winding 2 over two layers 5a and 5b, and the third winding 3 over one layer 5c.

The circuits in FIG. 4 are galvanically isolated from one another by the insulations T1 and T2 and likewise from the magnetic core by the insulation 3. In this exemplary embodiment, the magnetic core is formed from two core parts 4 and 41, which are arranged next to one another and penetrate the printed circuit board arrangement 9 in the region 11. Here, the circuit 2 can encompass the region 11, for example, and thereby interact with both cores 4 and 41. Although the individual windings or circuits 1, 2, 3 can be arranged on different layers 5a to 5c, they are essentially to be considered as being horizontally next to one another, as the insulation layers (insulation 1, insulation 2) are formed in the horizontal dimension. Only the third insulation (insulation 3), which separates the circuits from the magnetic cores 4, 41, extends through the two minimum parts T31 and T32 in the vertical dimension. The overall insulation thickness is therefore only a minimum of 1×T0, even in the case of three circuits which are to be safely galvanically isolated, wherein once again T0 is the minimum insulation thickness in the insulating medium taking into account the protection level.

The horizontal relocation of the individual circuits and the accompanying reduced thickness or reduced extension in the vertical direction of the transducer 20 can involve an increased surface area requirement in the horizontal dimension.

Figure 5:
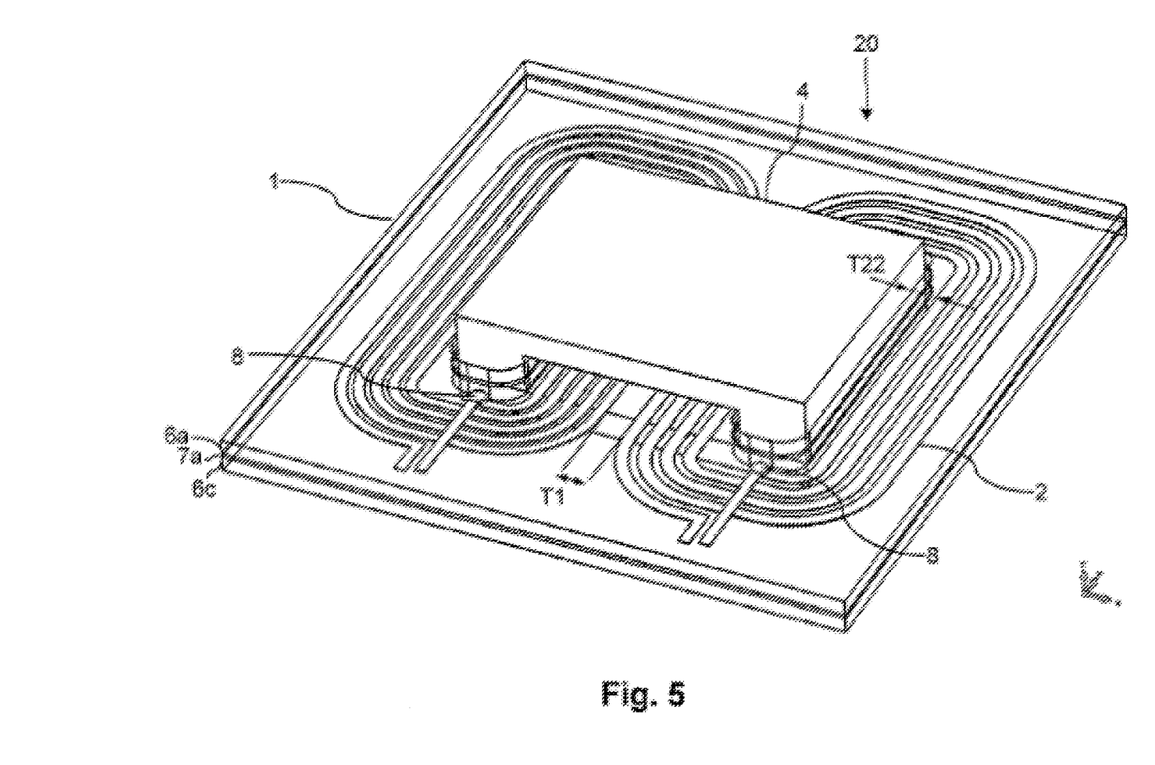
FIG. 5 and FIG. 6 each show a schematic diagram in two different exploded views of a transducer with two circuits according to a further exemplary embodiment of the invention.
Figure 6:
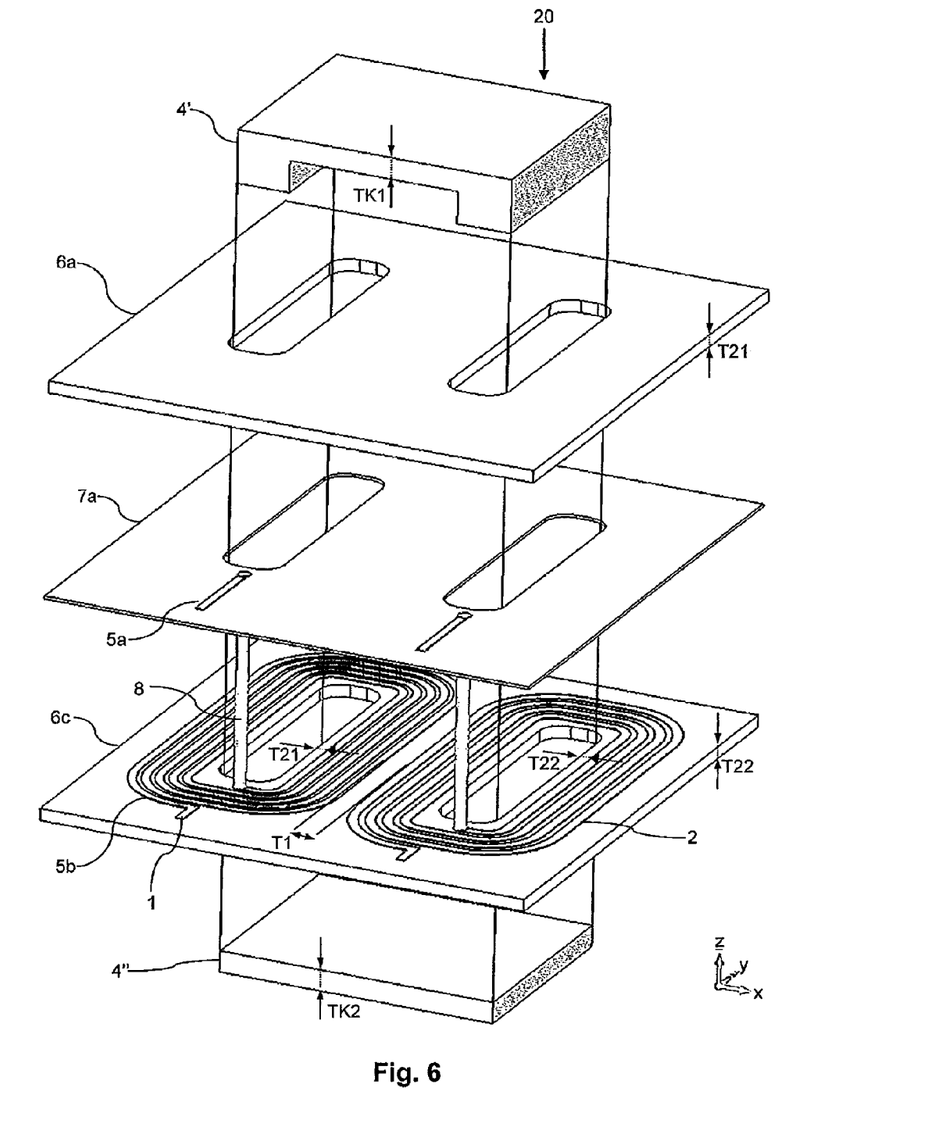

A further exemplary embodiment of the variant with two windings is shown in FIG. 5 and FIG. 6.

In FIG. 5, two circuits 1, 2, which are galvanically isolated from one another, are magnetically coupled with one another with a primary winding and a secondary winding in each case. For this purpose, conductor tracks of the respective potential group 1, 2 are arranged next to one another on an insulating carrier 6c and separated from one another by the insulation T1.

The windings of the two spiral-shaped coils are arranged on an electrically conducting layer 5b and the return conductor on the layer 5a. The two layers are electrically connected to one another at two points by means of connecting elements 8. The thin insulating layer 7a separates the two electrically conducting layers 5a and 5b from one another. In this exemplary embodiment, the magnetic core 4 has two parts, a U-shaped core half 4' and an I-shaped core half 4", which can be glued or clamped together, for example. The two core halves 4' and 4" can be connected to one another through cutouts, for example milled holes. As the core can be considered to be electrically conducting, an appropriate insulation should also be provided between the individual circuits 1, 2 and the core 4.

In FIG. 5, on the one hand, one insulation is realized by the two insulating layers 6a with the thickness T21 and 6c with the thickness T22. On the other hand, the windings of the circuits 1, 2 do not project as far as the cutout for the core 4, as a result of which there is a safe distance between the windings 1, 2 and the core 4 of at least T21 or T22 respectively on all sides. According to FIG. 3, the overall thickness of the transducer 20 is made up substantially of the thickness of the two insulating layers 6a and 6c and the thickness of the two core parts TK1 and TK2, wherein the insulating layer 7a can be substantially thinner than the two insulating layers 6a, 6c.

In the exemplary embodiment of FIG. 5 and FIG. 6, the overall thickness of the structure is about 4 mm in the z-direction, while the surface area requirement is about 20 mm in the x-direction and about 19.5 mm in the y-direction, wherein the coordinates x and y in each case span a horizontal plane in FIG. 5 and FIG. 6.

FIG. 6 shows a layer structure of the intrinsically safe transducer 20 from FIG. 5 in a dismantled state. The transducer 20 has a first insulating layer 6a of thickness T21, a second insulating layer 7a and a third insulating layer 6c of thickness T22. The first circuit 1 and the second circuit 2 are arranged on the third layer 6c on the side facing the second layer, in each case on the conductor track layer 5b. Circuits 1, 2 encompass hollow spaces or cutouts, in which the magnetic core of the transducer 20 engages. Here, the circuits 1, 2 are at distances T21, T22 respectively from the magnetic core in the horizontal direction. In the vertical direction (z-direction), the third layer 6c has a thickness of T22.

Combining a U-shaped magnetic core half 4' with an I-shaped magnetic core half 4" enables the two windings 1 and 2 or circuits to be placed next to one another. A strong coupling between the individual coils 1, 2 can be provided by the magnetic core 4', 4". The geometric shape of the core parts 4', 4" can be changed in various ways; for example, two identical U-shaped magnetic core halves can be connected to one another. Rounded-off structures are also conceivable.

LIST OF REFERENCES

1 Circuit or potential group
2 Circuit or potential group
3 Circuit or potential group
4 Magnetic core
4' First part of a magnetic core
4" Second part of a magnetic core
41 Second magnetic core
5a to 5g Conductor track layers
6a to 6c Insulation layers between the circuits
7a to 7b Insulation layers within a circuit
8 Electrical contact
9 Printed circuit board
10 Conventional transducer or transformer
11 Region of a cutout in a printed circuit board
20 Transducer or transformer according to the invention
T0 Minimum insulation/Protection level/Insulation thickness
TK1 First thickness of a magnetic core
TK2 Second thickness of a magnetic core
T1 First insulation thickness
T2 Second insulation thickness
T21 Distance/Insulation thickness
T22 Distance/Insulation thickness
T31 Distance/Insulation thickness
T32 Distance/Insulation thickness

What is claimed is:

1. A planar transducer having a vertical extension and a horizontal extension having:
   a layer structure with a plurality of circuits, wherein a first circuit and at least one second circuit are galvanically isolated from one another by a first insulation, wherein the layer structure has a horizontal and a vertical extension, and wherein a sequence of insulating layers and conducting layers is provided in the vertical extension;
   at least one magnetic core, which at least partially encompasses the layer structure and acts at least on the first circuit and on the second circuit, wherein the first and the second circuit in the layer structure are arranged next to one another in a horizontal extension, and the first circuit and the second circuit lie substantially in one plane and form a layer of the layer structure in that the circuits extend vertically over at least one or more conducting layers separated by insulating layers which are arranged vertically above one another;
   wherein the planar transducer is an intrinsically safe transducer;
   wherein the first circuit and the at least one second circuit are at a minimum insulation thickness T0 of the first insulation from one another;
   wherein the minimum insulation thickness T0 corresponds to the required protection level of the intrinsically safe transducer, and at no geometrical point of the transducer is the insulation distance less than the minimum insulation distance T0 between the circuits,
   wherein, in the horizontal layer extension, the insulation distance to be maintained is provided by the first insulation with the minimum insulation thickness T0 of the insulation material of the insulation layers in the horizontal extension between the circuits which are arranged next to one another,
   wherein, in the vertical layer extension, a second insulation is provided between individual windings of the circuits and the magnetic core, and the thickness of the second insulation has a first part and a second part and, in total, the parts have at least the minimum insulation thickness T0, and that an overall insulation thickness as the sum of the thickness of insulation layers in the vertical extension of the transducer is divided into the first part and the second part,
   wherein the first part lies in the vertical extension above the layer of the circuits,
   wherein the second part lies in the vertical extension below the circuits,
   wherein the sum of the parts is greater than or equal to the minimum insulation thickness T0, and
   wherein the minimum insulation thickness T0 is divided into the first part and into the second part of the overall insulation thickness in such a way that no part is less than one-third of the thickness of the overall Dart calculated from the sum of the two parts.

2. The transducer as claimed in claim 1, wherein the layer structure has layers running in the horizontal extension, and wherein the first circuit and the at least one second circuit are arranged on a common horizontal layer.

3. The transducer as claimed in claim 1, wherein an overall insulation thickness in the vertical extension of the transducer is 1×T0.

4. The transducer as claimed in claim 1, wherein the minimum insulation thickness T0 is divided into two equal parts of the overall insulation thickness.

5. The transducer as claimed in claim 1, wherein conducting layers within the first circuit and the at least one second circuit form one or more windings of a coil in that the conducting layers of the first circuit and of the second circuit are in each case connected by means of an electrical connection.

6. The transducer as claimed in claim 1, wherein, for a required minimum insulation thickness T0 of the insulation layer of substantially 1 mm, an overall thickness of the transducer is not more than about 4.5 mm, at least not significantly greater than about 4.5 mm.

7. The transducer as claimed in claim 1, wherein the minimum insulation thickness T0 is at least about 0.25 mm.

* * * * *